United States Patent
Oshida (10) Patent No.: US 8,194,367 B2
(45) Date of Patent: Jun. 5, 2012

(54) ACCUMULATION DEVICE

(75) Inventor: Syuji Oshida, Osaka (JP)

(73) Assignee: Panasonic Corporation, Osaka (JP)

( * ) Notice: Subject to any disclaimer, the term of this patent is extended or adjusted under 35 U.S.C. 154(b) by 203 days.

(21) Appl. No.: 12/808,277

(22) PCT Filed: Dec. 16, 2008

(86) PCT No.: PCT/JP2008/003780
§ 371 (c)(1),
(2), (4) Date: Jun. 15, 2010

(87) PCT Pub. No.: WO2009/078167
PCT Pub. Date: Jun. 25, 2009

(65) Prior Publication Data
US 2010/0295375 A1    Nov. 25, 2010

(30) Foreign Application Priority Data
Dec. 18, 2007 (JP) ................... 2007-325564

(51) Int. Cl.
*H02H 5/04* (2006.01)
(52) U.S. Cl. ........................... 361/18; 361/23
(58) Field of Classification Search ............... 361/18, 361/23; 307/9.1, 10.1, 82
See application file for complete search history.

(56) References Cited

U.S. PATENT DOCUMENTS 6,160,380 A    12/2000 Tsuji et al.
7,679,337 B2 *   3/2010 Yoshida et al. ............... 320/167

FOREIGN PATENT DOCUMENTS

| JP | 58-043176 | 3/1983 |
| JP | 10-289734 | 10/1998 |
| JP | 2000-206215 A | 7/2000 |
| JP | 2002-369401 A | 12/2002 |
| JP | 2003-134801 A | 5/2003 |
| JP | 2006-034006 A | 2/2006 |

OTHER PUBLICATIONS

International Search Report for International Application No. PCT/JP2008/003780, Mar. 24, 2009, Panasonic Corporation.

* cited by examiner

*Primary Examiner* — Danny Nguyen
(74) *Attorney, Agent, or Firm* — RatnerPrestia (57) ABSTRACT

When an electricity storage unit is being charged or discharged, a control circuit obtains efficiency Efn of a DC/DC converter based on input/output voltage value Vi, input/output current value I and electricity storage unit voltage value Vc detected by an input/output voltage detection circuit, an input/output current detection circuit, and an electricity storage unit voltage detection circuit, respectively. By using temperature T a detected by temperature sensor, when efficiency Efn lies out of predetermined range (from Emin to Emax) according to input/output voltage value Vi, input/output current value I, electricity storage unit voltage value Vc and temperature T, at least any one of an electricity storage unit and the DC/DC converter is determined to be abnormal.

10 Claims, 7 Drawing Sheets

To vehicle side control circuit

FIG. 8 PRIOR ART

ACCUMULATION DEVICE

This application is a U.S. National Phase application of PCT International application PCT/JP2008/003780.

TECHNICAL FIELD

The present invention relates to an electricity storage device which stores power in an electricity storage unit at the time of braking and discharges the stored power when needed except for when braking.

BACKGROUND ART

In recent years, an automobile (hereinafter, referred to as a "vehicle") has been developed which generates electricity at the time of braking in order to consider the environment and increase fuel-efficiency. The braking energy generated at the time of braking is recovered as electric energy by use of a regeneration system. This regeneration system charges power (hereinafter, referred to as "regeneration power") generated from a generator when the vehicle reduces speed. The charged regeneration power is used in running the vehicle except for the reduction of speed. Therefore, it is possible to decrease the generation amount of the generator except for the reduction of speed. As a result, the load on the engine for generating electricity by the generator is decreased, and thereby the fuel-efficiency of the vehicle can be increased. Regeneration power is generated in a large amount for a short period of time at the time of the reduction of speed. The generated regeneration power is recovered to an electricity storage device which charges the power in an electric double layer capacitor via a DC/DC converter. The electric double layer capacitor has good rapid charging/discharging characteristics and thus is suitable for recovering the regeneration power.

Figure 7:
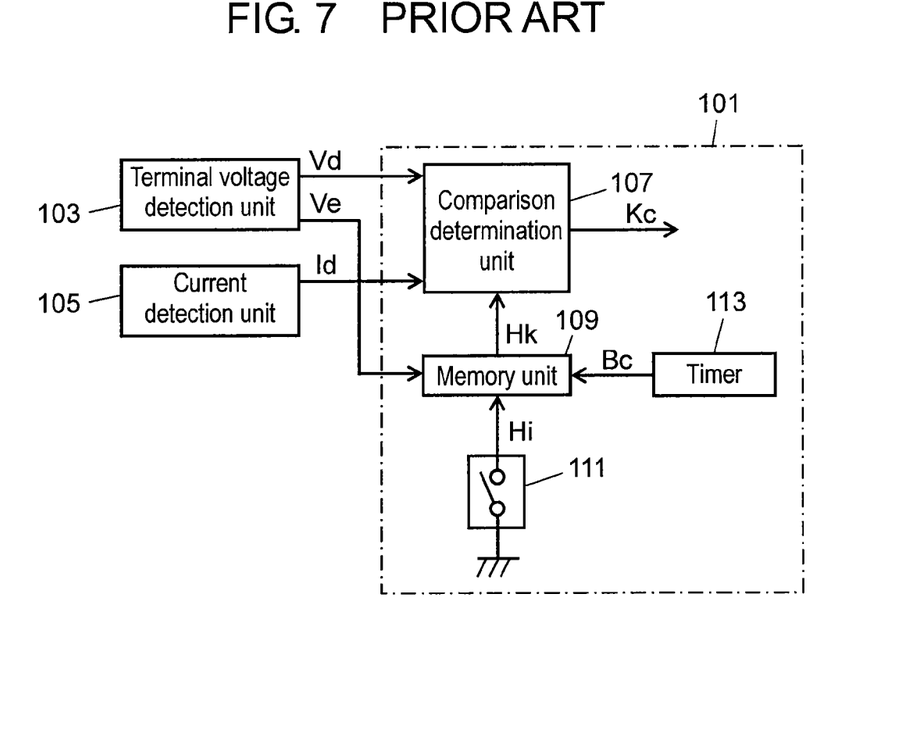
FIG. 7 is a block diagram of a main part of an abnormality determination means in a vehicle power diagnosis device of a prior art.

When this electricity storage device is mounted in a vehicle, detection and determination of abnormality occurring in the electricity storage device is required to have a high reliability. A device determining abnormality is disclosed in, for example, Patent Citation 1. FIG. 7 is a block diagram illustrating the main part of an abnormality determination unit in a vehicle power diagnosis device in Patent Citation 1.

In FIG. 7, terminal voltage detection unit 103 detecting terminal voltage value Vb of a battery and current detection unit 105 detecting discharging current value Ib of the battery are connected to abnormality determination unit 101. Abnormality determination unit 101 is provided with comparison determination unit 107 and memory unit 109. Of detection results by terminal voltage detection unit 103, terminal voltage signal Vd is transmitted to comparison determination unit 107 and terminal voltage signal Ve is transmitted to memory unit 109. Of the detection results by current detection unit 105, detection current signal Id is transmitted to comparison determination unit 107.

Abnormality determination unit 101 is provided with memory removal unit 111 connected to memory unit 109, and timer 113. Memory removal unit 111 is a switch removing terminal voltage signal Ve stored in memory unit 109. If memory removal unit 111 is turned on at the time of changing a battery, terminal voltage signal Ve is reset to a predetermined value. Timer 113 transmits starting signal Bc to memory unit 109 after elapse of a predetermined time since the ignition SW is turned on.

Figure 8:
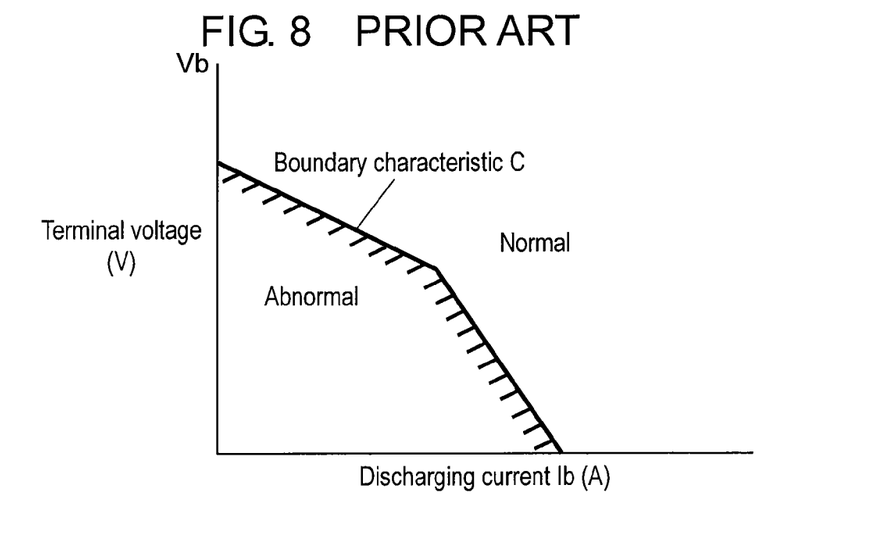
FIG. 8 is a graph illustrating boundary characteristics of a normal battery or an abnormal battery in the vehicle power diagnosis device of the prior art.

Next, the operation of abnormality determination unit 101 of the vehicle power diagnosis device will be described. Boundary characteristic C with respect to discharging current value Ib and terminal voltage value Vb of a battery is stored in memory unit 109 in advance. Boundary characteristic C is a characteristic indicating a boundary between normality and abnormality of a battery when discharging current value Ib is expressed on the transverse axis and terminal voltage value Vb is expressed on the longitudinal axis. When discharging current value Ib and terminal voltage value Vb reach the region below boundary characteristic C surrounded by the oblique line, the battery is determined to be abnormal. Terminal voltage signal Vd from the terminal voltage detection unit 103 and detection current signal Id from current detection unit 105 are input to comparison determination unit 107. Characteristic signal Hk based on terminal voltage value Vb and discharging current value Ib from memory unit 109 is input to comparison determination unit 107 together with terminal voltage signal Vd and detection current signal Id. Comparison determination unit 107 compares terminal voltage signal Vd and detection current signal Id with characteristic signal Hk. As a result of the comparison, when terminal voltage signal Vd and detection current signal Id are smaller than characteristic signal Hk and are thereby placed in the region equal to or less than boundary characteristic C, the battery is determined to be abnormal. If the battery is abnormal, comparison determination unit 107 outputs abnormality signal Kc. Based on abnormality signal Kc, an abnormality warning means or the like notifies the driver of the occurrence of the abnormality.

Like the prior art, a battery abnormality can be determined even when the above-described vehicle power diagnosis device is used for a vehicle which does not recover regeneration energy. However, in a vehicle mounted with an electricity storage device using a regeneration system, there are problems as follows.

In the electricity storage device using the regeneration system, an electric double layer capacitor is used as an electricity storage unit. Charging and discharging of this electric double layer capacitor are carried out via the DC/DC converter. When regeneration power is charged in the electricity storage device by this configuration, and when the abnormality is determined in the same manner as the prior art based on the voltage between a positive polarity and a negative polarity of the electricity storage device and a current flowing through them, there is a possibility that it is uncertain whether or not the electricity storage unit is normally charged. That is to say, a portion of a current input to the DC/DC converter flows as a leakage current due to abnormality of the DC/DC converter. In this case, the current flowing to the electricity storage unit lessens, and thereby the charging voltage is lowered. However, if only the voltage between a positive polarity and a negative polarity of the electricity storage device and the current flowing through them are detected, there is a possibility that the electricity storage device lies in a normal range in appearance. As a result, although the DC/DC converter is abnormal, the electricity storage device is probably determined to be normal.

[Patent Citation 1] JP-A-2000-206215

DISCLOSURE OF INVENTION

An electricity storage device according to the present invention, which is an electricity storage device storing power generated from a generator, includes an electricity storage unit, a DC/DC converter, an electricity storage unit voltage detection circuit, an input/output voltage detection circuit, an input/output current detection circuit, and a control circuit. The DC/DC converter has an electricity storage unit terminal connected to the electricity storage unit and an input/output terminal connected to the generator. The electricity storage unit voltage detection circuit detects a voltage value of the electricity storage unit from the electricity storage unit terminal. The input/output voltage detection circuit detects a voltage value of power input to and output from the DC/DC converter from the input/output terminal. The input/output current detection circuit detects a current value of power input to and output from the DC/DC converter. The control circuit calculates the efficiency of the DC/DC converter when the DC/DC converter carries current, by use of the input and output power amount for the DC/DC converter calculated based on the voltage value detected by the input/output voltage detection circuit and the current value detected by the input/output current detection circuit, and the power amount for the electricity storage unit calculated based on the voltage value detected by the electricity storage unit voltage detection circuit and the capacitance value of the electricity storage unit. Further, the control circuit determines the electricity storage unit and the DC/DC converter to be normal when the efficiency lies in a predetermined range and determines at least one of the electricity storage unit and the DC/DC converter to be abnormal when the efficiency lies out of the predetermined range.

By use of the electricity storage device described above, at least any one of the electricity storage unit and the DC/DC converter can be determined to be abnormal. As a result, reliability of the electricity storage device is increased.

DETAILED DESCRIPTION OF THE INVENTION

BEST MODE FOR CARRYING OUT THE INVENTION

Embodiment 1

Figure 1:
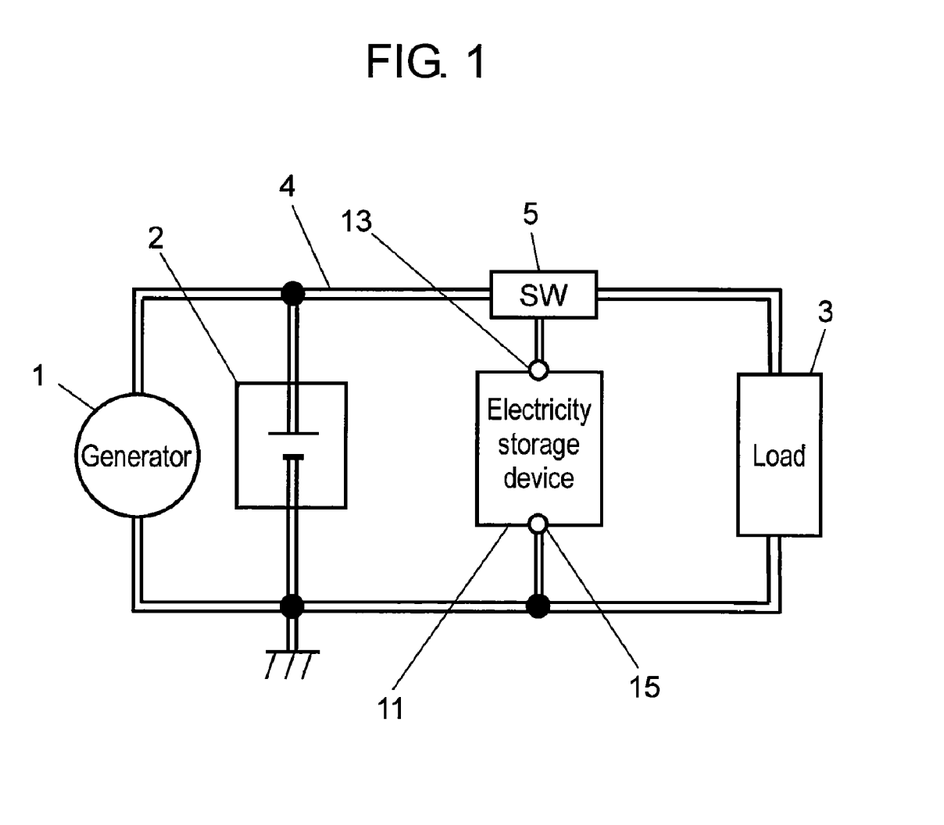
FIG. 1 is a conceptual diagram of a power supply device using an electricity storage device according to an embodiment 1 of the present invention.

FIG. 1 is a conceptual diagram of a power supply device using an electricity storage device according to an embodiment 1 of the present invention. In FIG. 1, power generated from generator 1 is supplied to battery 2 or various kinds of loads 3 mounted in a vehicle. At the time of braking of the vehicle, switch unit 5, provided on power line 4 which enables generator 1, battery 2 and load 3 to be connected to each other, is changed. Regeneration power generated from generator 1 is supplied to electricity storage device 11.

Figure 2:
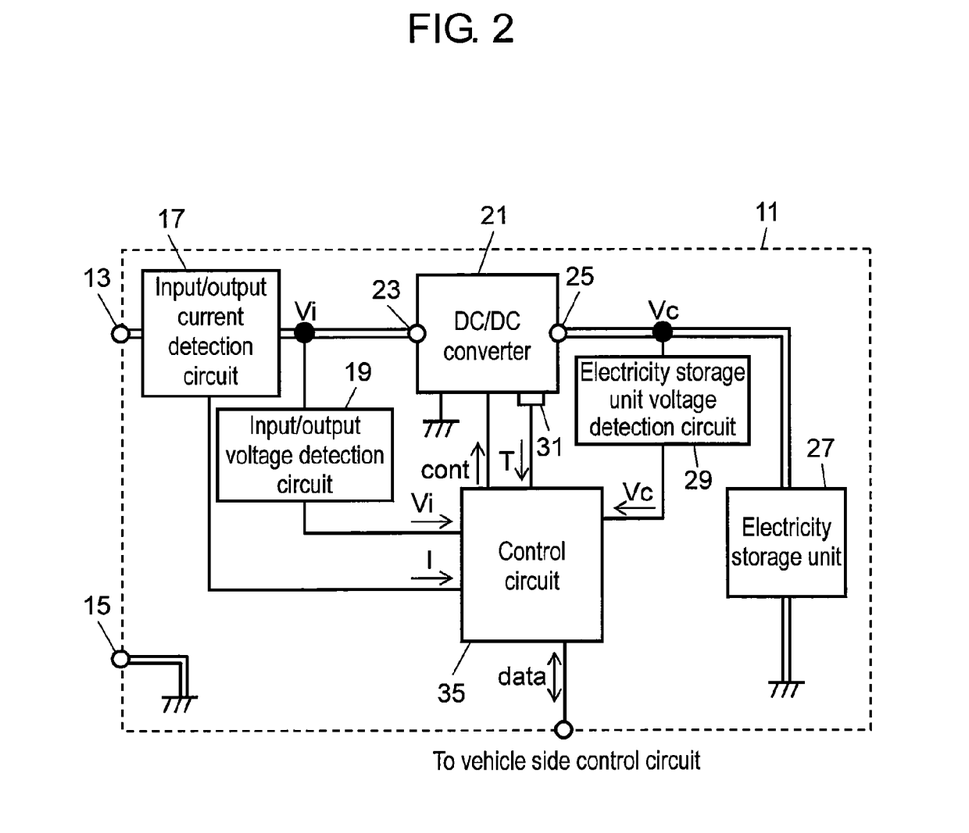
FIG. 2 is a block circuit diagram of the electricity storage device according to the embodiment 1 of the present invention.

FIG. 2 is a block circuit diagram of the electricity storage device according to the embodiment 1 of the present invention. In FIG. 2, the double line indicates a power line, and the solid line indicates a signal line. Hereinafter, in this embodiment 1, a case where electricity storage device 11 is applied to a regeneration system of a vehicle will be described.

In FIG. 2, positive polarity 13 and negative polarity 15 provided in the electricity storage device 11 are connected to generator 1, battery 2 and load 3 and so forth. Switch unit 5 provided on power line 4 is changed depending on driving states of the vehicle. By the change of this switch unit 5, regeneration power generated from generator 1 is charged in electricity storage device 11 at the time of braking of the vehicle. Except for the braking of the vehicle, the power stored in electricity storage device 11 can be discharged to battery 2 or load 3.

A configuration of electricity storage device 11 will now be described. According to the embodiment 1 of the present invention, electricity storage device 11, which stores power generated from generator 1, has electricity storage unit 27, DC/DC converter 21, electricity storage unit voltage detection circuit 29, input/output voltage detection circuit 19, input/output current detection circuit 17, and control circuit 35. DC/DC converter 21 has electricity storage unit terminal 25 connected to electricity storage unit 27 and input/output terminal 23 connected to generator 1. Electricity storage unit voltage detection circuit 29 detects a voltage value of electricity storage unit 27 from electricity storage unit terminal 25. Input/output voltage detection circuit 19 detects a voltage value of power which is input to and output from DC/DC converter 21, from input/output terminal 23. Input/output current detection circuit 17 detects a current value of the power which is input to and output from DC/DC converter 21. Control circuit 35 calculates the efficiency of DC/DC converter 21 when DC/DC converter 21 carries current, by use of the input and output power amount for DC/DC converter calculated based on the voltage value detected by input/output voltage detection circuit 19 and the current value detected by input/output current detection circuit 17, and a power amount for electricity storage unit 27 calculated based on the voltage value detected by electricity storage unit voltage detection circuit 29 and the capacitance value of the electricity storage unit 27. Further, control circuit 35 determines the electricity storage unit 27 and DC/DC converter 21 to be normal when the efficiency lies in a predetermined range, and determines at least one of electricity storage unit 27 and DC/DC converter 21 to be abnormal when the efficiency lies out of the predetermined range.

The inside of electricity storage device 11 is partitioned into an input/output side and an electricity storage unit side with respect to DC/DC converter 21 which is a boundary. The input/output side refers to a side connected to generator 1 and load 3 via positive polarity 13 from DC/DC converter 21. The electricity storage unit side refers to a side connected to electricity storage unit 27 from DC/DC converter 21. In the input/output side of electricity storage device 11, input/output current detection circuit 17 and input/output voltage detection circuit 19 are provided between positive polarity 13 and input/output terminal 23 of DC/DC converter 21. Input/output current detection circuit 17 detects the value of a current (hereinafter, referred to as an "input/output current value I") flowing between positive polarity 13 and input/output terminal 23. Input/output voltage detection circuit 19 detects the value of a voltage (hereinafter, referred to as an "input/output voltage value Vi") applied to input/output terminal 23.

In the electricity storage unit side of electricity storage device 11, electricity storage unit voltage detection circuit 29 is provided between electricity storage unit 27 and electricity storage unit terminal 25. Electricity storage unit voltage detection circuit 29 detects the voltage value of electricity storage unit 27 (hereinafter, referred to as an "electricity storage unit voltage value Vc"). When an electric double layer capacitor is used in electricity storage unit 27, it can handle power which changes greatly in a short time. The electric double layer capacitor used in electricity storage unit 27 may be connected in series or connected in series in plurality, and detailed matters regarding the number thereof or a connection method may be determined depending on necessary power.

In this configuration, for example, if a leakage current flows from DC/DC converter 21 at the time of charging, the efficiency of DC/DC converter 21 is decreased. When this efficiency is below the lower limit of a predetermined range, DC/DC converter 21 can be determined to be abnormal.

When electricity storage unit 27 deteriorates and thus the capacitance value thereof decreases, the voltage of the electricity storage unit is promptly increased. The capacitance value used for the calculation of the efficiency of DC/DC converter 21 is an initial value which is constant. Therefore, the efficiency of DC/DC converter 21 is increased on the numerical formula. Thus, if the efficiency exceeds the upper limit of a predetermined range, an abnormality can be determined due to deterioration of electricity storage unit 27.

According to the combination of determination described above, at least any one of electricity storage unit 27 and DC/DC converter 21 can be determined to be abnormal. As a result, the reliability of electricity storage device 11 is improved.

In other words, according to the present invention, by use of the above-described configuration, the input/output power calculated from input/output current detection circuit 17 and input/output voltage detection circuit 19 provided in input/output side terminal 23 of DC/DC converter 21 is compared with the electricity storage unit power calculated from electricity storage unit voltage detection circuit 29 and the capacitance value of the electricity storage unit 27 provided in electricity storage unit side terminal 25 of DC/DC converter 21. When the efficiency of DC/DC converter 21 obtained from this comparison result exceeds a predetermined reference range, at least one of electricity storage unit 27 and DC/DC converter 21 is determined to be abnormal. Therefore, reliability in abnormality determination by electricity storage device 11 is increased.

Hereinafter, the embodiment 1 will be described in detail. In the following description using FIG. 2, input/output current detection circuit 17, input/output voltage detection circuit 19, and electricity storage unit voltage detection circuit 29 are constituted as separate bodies, respectively. These may be formed with DC/DC converter 21 as a single body and give an additional function to DC/DC converter 21. In this case, input/output voltage value Vi, input/output current value I and electricity storage unit voltage value Vc are output from DC/DC converter 21.

DC/DC converter 21 is provided with temperature sensor 31. Temperature sensor 31 detects temperature T in the vicinity of DC/DC converter 21.

Control circuit 35 is connected, via the signal lines, to DC/DC converter 21, input/output voltage detection circuit 19, input/output current detection circuit 17, electricity storage unit voltage detection circuit 29, and temperature sensor 31. Control circuit 35 is constituted by a microcomputer and peripheral circuits of the microcomputer. Electricity storage device 11 is controlled by control circuit 35. In this configuration, input/output voltage value Vi from input/output voltage detection circuit 19, input/output current value I from input/output current detection circuit 17, electricity storage unit voltage value Vc from electricity storage unit voltage detection circuit 29, and temperature T from temperature sensor 31 are transmitted to control circuit 35. When DC/DC converter 21 receives control signal "cont" from control circuit 35, DC/DC converter 21 performs charging and discharging control for electricity storage unit 27. Control circuit 35 also transmits and receives data signal "data" to and from a control device provided in the vehicle.

Figure 3:
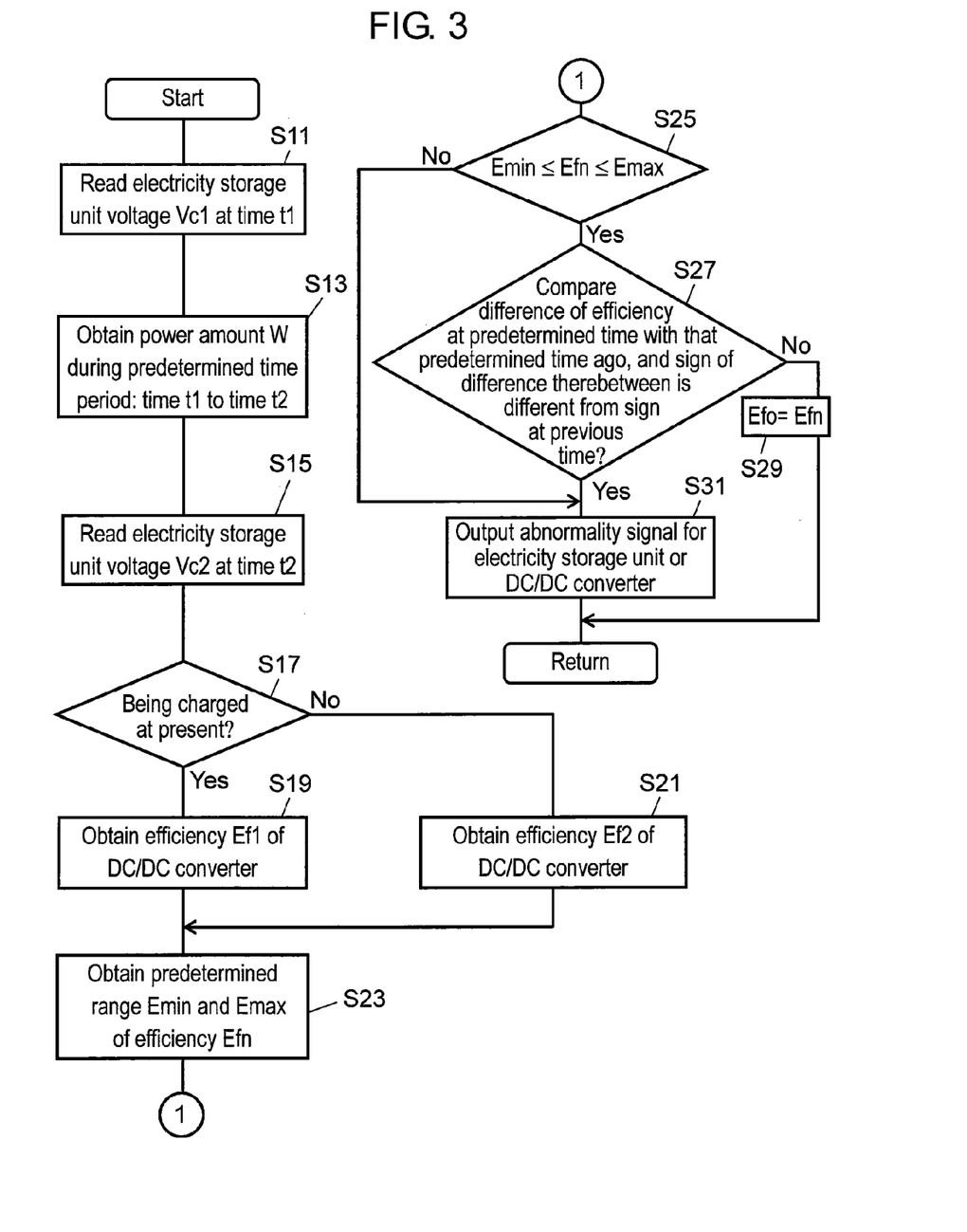
FIG. 3 is a flowchart illustrating abnormality determination by the electricity storage device according to the embodiment 1 of the present invention.

Next, an operation of determining abnormality by electricity storage device 11 will be described. FIG. 3 is a flowchart illustrating abnormality determination for electricity storage device 11 according to embodiment 1 of the present invention.

Control circuit 35 enables the electricity storage device 11 to work by executing a main routine. Further, control circuit 35 executes many sub-routines if necessary, in addition to the main routine. The flowchart shown in FIG. 3 is an example of this sub-routine. Hereinafter, all flowcharts are shown as the sub-routine in the same manner.

When control circuit 35 executes the sub-routine shown in FIG. 3, electricity storage unit 27 is charged or discharged. In detail, DC/DC converter 21 is operated by control circuit 35 and thus electricity storage unit 27 is charged or discharged. In other words, control circuit 35 grasps that electricity storage unit 27 is being charged or discharged.

The sub-routine shown in FIG. 3 is executed at a predetermined time interval when electricity storage unit 27 is charged or discharged. For example, this predetermined time is set to two seconds. As above, when the sub-routine shown in FIG. 3 is executed at a necessary time interval, appropriate abnormality detection can be made for DC/DC converter 21 or electricity storage unit 27.

The sub-routine shown in FIG. 3 will be described in detail. When the sub-routine shown in FIG. 3 is executed, electricity storage unit voltage value Vc1 at present time t1 is transmitted to control circuit 35 from electricity storage unit voltage detection circuit 29 (S11). Next, control circuit 35 performs the following operations to obtain power amount W flowing through input/output terminal 23 during a predetermined time period from time t1 to time t2 after one second (S13).

Control circuit 35 receives input/output voltage value Vi from input/output voltage detection circuit 19, and input/output current value I from input/output current detection circuit 17. Control circuit 35 obtains a product of both sides (Vi·I) by the use of the received results. This value is integrated during the predetermined time period from time t1 to time t2. This operation may be expressed by the following equation.

$$W = \int_{t1}^{t2} (Vi \cdot I) dt \qquad \text{[Equation 1]}$$

From this operation result, power amount W input to electricity storage device 11 or output from electricity storage device 11 during the predetermined time period is obtained. Power amount W corresponds to an input and output power amount for DC/DC converter 21.

Electricity storage unit voltage value Vc2 at time t2 is transmitted to control circuit 35 from electricity storage unit voltage detection circuit 29 (S15). Control circuit 35 determines whether or not electricity storage unit 27 is currently being charged (S17). As described above, control circuit 35 can determine, from the instruction content for DC/DC converter 21, if electricity storage unit 27 is being charged or discharged.

When electricity storage unit 27 is being charged (Yes at step S17), control circuit 35 obtains efficiency Ef1 of DC/DC converter 21 by the use of the following equation (S19).

$$Ef1 = \frac{C \cdot |Vc2^2 - Vc1^2|}{2 \cdot \int_{t1}^{t2}(Vi \cdot I)dt} \quad \text{[Equation 2]}$$

Here, C represents the capacitance value of electricity storage unit 27, Vc1 represents electricity storage unit voltage value at time t1, Vc2 represents electricity storage unit voltage value at time t2, Vi represents input/output voltage value, and I represents input/output current value.

Power amount W has been already obtained at step S13, and thus efficiency Ef1 is obtained by assigning (Equation 1) to (Equation 2) at step S19. This result shows Ef1=C·|Vc2²−Vc1²|/(2·W). Capacitance value C of electricity storage unit 27 is obtained as an initial value which is stored in a memory of control circuit 35 in advance. In other words, capacitance value C is constant.

Efficiency Ef1 of DC/DC converter 21 is defined as a ratio of an output power amount with respect to an input power amount. In (Equation 2), power amount W shown in the denominator corresponds to the input power amount and the other C·|Vc2²−Vc1²|/2 corresponds to the output power amount. The output power amount is charged in electricity storage unit 27, and thus the power amount (energy) charged in electricity storage unit 27 from time t1 to time t2 gives C·Vc2²/2−C·Vc1²/2=C·(Vc2²−Vc1²)/2. However, when electricity storage unit 27 is discharged, the sign in the parenthesis turns negative. Therefore, when an absolute value in the parenthesis is obtained as a general formula, the power amount output from electricity storage unit 27 gives the above-described C·|Vc2²−Vc1²|/2. As apparent from the above description, efficiency Ef1 of DC/DC converter 21 becomes the value expressed by (Equation 2).

Internal resistance value R exists in electricity storage unit 27. Thus, when charging current value Ic flows into electricity storage unit 27, a part of power charged in electricity storage unit 27 from DC/DC converter 21 is consumed as a heat. Consumed heat energy Eh is expressed by Eh=R·∫Ic²·dT. The integral range is from time t1 to time t2 during which charging current value Ic flows through the electricity storage unit 27.

From the above description, efficiency Ef1 is accurately given as Ef1=(C·|Vc2²−Vc1²|+2·Eh)/(2·W).

However, electricity storage device 11 according to the embodiment 1 is used for recovery of regeneration power of a vehicle for actual measurement, and the following result has been obtained. The numerator of the equation for obtaining efficiency Ef1 was calculated using measurement values such as capacitance value C, internal resistance value R, electricity storage unit voltage values Vc1 and Vc2, and charging current value Ic. As a result, the first term of (C·|Vc2²−Vc1²|) was substantially greater than the second term (2·Eh) by an order of magnitude. Therefore, in this embodiment 1, the term of heat energy Eh is neglected, and (Equation 2) for obtaining an approximate value is designated as an equation for obtaining a value of efficiency Ef1.

Generally, when the electricity storage unit 27 deteriorates as time goes by, capacitance value C becomes less and internal resistance value R becomes greater. As a result, the amount lost as heat energy Eh increases. However, the electricity storage unit 27 which deteriorated was actually measured, and a variation amount in internal resistance value R was the same order as an absolute value in internal resistance value R before and after the deterioration. Thus, even when internal resistance value R increases due to the deterioration of electricity storage unit 27, the influence of heat energy Eh is still insignificant. Thereby, the term of heat energy Eh is neglected in (Equation 2) regardless of the deterioration of capacitance value C of electricity storage unit 27.

As described above, electricity storage device 11 has a configuration in which electricity storage unit 27 is connected to DC/DC converter 21. According to this configuration, the power amount output from DC/DC converter 21 can be operated as the power amount charged in the electricity storage unit 27 by the use of capacitance value C of electricity storage unit 27 and electricity storage unit voltage values Vc1 and Vc2. As a result, there is no need for detecting the current flowing through electricity storage unit terminal 25 and thus efficiency Ef1 can be obtained by the simple circuit configuration. After calculating efficiency Ef1, the process goes to step S23 described later.

On the other hand, if electricity storage unit 27 is not being charged at present (No at step S17), it is being discharged. Control circuit 35 obtains efficiency Ef2 of DC/DC converter 21 from (Equation 3) which is a reciprocal number of (Equation 2) (S21).

$$Ef2 = \frac{2 \cdot \int_{t1}^{t2}(Vi \cdot I)dt}{C \cdot |Vc2^2 - Vc1^2|} \quad \text{[Equation 3]}$$

Here, C represents the capacitance value of electricity storage unit 27, Vc1 represents electricity storage unit voltage value at time t1, Vc2 represents electricity storage unit voltage value at time t2, Vi represents input/output voltage value, and I represents input/output current value.

This is because a power amount input to and a power amount output from DC/DC converter 21 are reversed. In other words, since the power stored in electricity storage unit 27 is supplied to outside of electricity storage device 11 at the time of discharging, a power amount which is input to DC/DC converter 21 during a predetermined time period from time t1 to time t2 corresponds to a power amount (energy) discharged by electricity storage unit 27. Therefore, the power amount is given as C·Vc1²/2−C·Vc2²/2=C·(Vc1²−Vc2²)/2=C·|Vc2²−Vc1²|/2. Power amount W output from DC/DC converter 21 during the predetermined time period is expressed by (Equation 1). From the above description, efficiency Ef2 of DC/DC converter 21 at the time of discharging is given by (Equation 3). Further, at step S21 in the same manner as step S19, efficiency Ef2=2·W/(C·|Vc2²−Vc1²|) is obtained by calculating a reciprocal number after assigning (Equation 1) to (Equation 2).

Next, if efficiency Efn (n=1, 2, the following is the same) has been obtained, control circuit 35 obtains predetermined range Emin and Emax of efficiency Efn recorded in the memory embedded in control circuit 35 by the use of the parameters which have been obtained at steps S13 and S15 and so forth (S23). In detail, predetermined range Emin and Emax is obtained by the use of input/output voltage value Vi2 at time t2, input/output current value I2, electricity storage unit voltage value Vc2, and temperature T of DC/DC converter 21 read from temperature sensor 31.

Here, predetermined range Emin and Emax of efficiency Efn will be described. There is a characteristic that as the difference between input/output voltage value Vi and electricity storage unit voltage value Vc increases, efficiency Efn of DC/DC converter 21 becomes less. Efficiency Efn is also influenced by input/output current value I or temperature T. As such, when each parameter is changed, efficiency Efn is varied within a predetermined range. Here, upper limit Emax of the predetermined range represents that DC/DC converter 21 is normal and deterioration of electricity storage unit 27 reaches the limit. In detail, it means the limit in which electricity storage unit 27 cannot be used any longer if the deterioration of electricity storage unit 27 progresses further than the current state (hereinafter, referred to as a "deterioration limit time"). Lower limit Emin of the predetermined range means the efficiency when DC/DC converter 21 is abnormal and electricity storage unit 27 is normal. When this predetermined range Emin and Emax are recorded in the memory embedded in control circuit 35 in advance, it is possible to obtain predetermined ranges Emin and Emax able to be given to efficiency Efn, according to input/output voltage value Vi2, input/output current value I2, electricity storage unit voltage value Vc2 and temperature T at present.

As described above, the range able to be given to efficiency Efn is obtained in advance when input/output voltage value Vi, input/output current value I, electricity storage unit voltage value Vc and temperature T in the normal state of electricity storage unit 27 and DC/DC converter 21 are changed. If the resultant values are stored as predetermined range Emin and Emax in control circuit 35, abnormality can be determined with high accuracy by electricity storage device 11 and thereby its reliability increases.

Subsequently, control circuit 35 determines efficiency Efn to lie in the predetermined range from Emin to Emax (S25). If efficiency Efn does not lie in the predetermined range from Emin to Emax (No at step S25), at least any one of electricity storage unit 27 and DC/DC converter 21 is determined to be abnormal. This detailed example is described below.

For example, it is assumed that a leakage current is generated due to abnormality of DC/DC converter 21. In this case, when electricity storage unit 27 is being charged, energy stored in electricity storage unit 27 is reduced as much as the leakage current, and thereby electricity storage unit voltage value Vc2 after elapse of time t2 is reduced as compared with when DC/DC converter 21 is normal. Thereby, the numerator of (Equation 2) is decreased, and thus efficiency Efn is lowered. As a result, if efficiency Efn becomes smaller than lower limit Emin, DC/DC converter 21 is determined to be abnormal.

When electricity storage unit 27 deteriorates, its capacitance value C decreases and thereby its internal resistance value R increases. As described above, since the influence by heat energy Eh due to the increase of internal resistance value R is insignificant, the variation of heat energy Eh due to the deterioration of electricity storage unit 27 is neglected in this embodiment 1. When the power amount (energy) stored in electricity storage unit 27 is constant, electricity storage unit voltage value Vc2 after elapse of time t2 increases as much as reduction of its capacitance value C. However, as described above, in this embodiment 1, the calculation is performed assuming capacitance value C in (Equation 2) to be constant as an initial value, and thus when the deteriorated electricity storage unit 27 is charged, only electricity storage unit voltage value Vc2 increases. As a result, on the numerical formula expressed by (Equation 2), the energy stored in electricity storage unit 27 is increased in company with the deterioration of electricity storage unit 27, and thereby the numerator in (Equation 2) also increases. Therefore, efficiency Efn becomes greater. From the above description, if efficiency Efn exceeds upper limit Emax of the predetermined range, electricity storage unit 27 can be determined to be abnormal due to deterioration.

Although various kinds of abnormal states are considered in addition thereto, at least any one of electricity storage unit 27 and DC/DC converter 21 can be determined to be abnormal by performing the above-described combination of the determination. In this case, the process proceeds to step S31 which will be described later.

On the other hand, if efficiency Efn lies in the predetermined range from Emin to Emax (Yes at step S25), both electricity storage unit 27 and DC/DC converter 21 are considered to be normal. However, there is a possibility that deterioration of electricity storage unit 27 and abnormality of DC/DC converter 21 progress at the same time so as to be balanced, and thereby efficiency Efn lies in the predetermined range from Emin to Emax. Therefore, in order to carry out abnormality determination for this case, control circuit 35 uses a difference between previous efficiency Efo obtained from abnormality determination at the previous time and this efficiency Efn obtained at this time. In other words, the difference between previous efficiency Efo and this efficiency Efn (=Efo−Efn) is obtained and then it is determined whether or not its sign is different from a difference between efficiency Efo at the time before the previous time and efficiency Efo at the previous time (S27). The sign at the previous time can be obtained by a sign flag (for example, 0 if positive, and −1 if negative) provided in the memory embedded in control circuit 35.

Here, the reason why the operation shown at step S27 is carried out will be described.

When a sudden abnormality occurs, for example, the power line for connecting electricity storage unit 27 or DC/DC converter 21 is disconnected, or the like, efficiency Efn promptly exceeds predetermined range from Emin to Emax. However, when deterioration of electricity storage unit 27 and abnormality of DC/DC converter 21 progress at the same time and thus efficiency Efn lies in the predetermined range from Emin to Emax, each abnormality can be regarded to be progressed slowly. In this case, each time the subroutine for abnormality determination is executed as shown in FIG. 3, there is a tendency that efficiency Efn is gradually increased or decreased. Therefore, the sign of the difference (=Efo−Efn) between previous efficiency Efo and this efficiency Efn is maintained to be negative when efficiency Efn is gradually increased and to be positive when efficiency Efn is gradually decreased. From this, if the sign becomes reverse, it is considered that abnormal progress of any one of electricity storage unit 27 and DC/DC converter 21 suddenly occurs. This problem enables at least any one of electricity storage unit 27 and DC/DC converter 21 to be determined to be abnormal due to an unstable operation as electricity storage device 11. In this way, reliability of electricity storage device 11 also increases.

At step S27, if the sign indicating the difference (=Efo−Efn) between previous efficiency Efo and this efficiency Efn which is compared is the same as that at the previous time thereof (No at step S27), abnormality gradually progresses. However, since efficiency Efn lies in the predetermined range from Emin to Emax at step S25, electricity storage unit 27 and DC/DC converter 21 are determined to be normal. In this case, previous efficiency Efo is updated by assigning this efficiency Efn to previous efficiency Efo (S29). Efo=Efn is shown at step S29, which means that a value of right term (Efn) is assigned to left term (Efo), and the same is true for the following. Although not shown in FIG. 3, the sign flag is also updated at this time. Thereafter, control circuit 35 finishes execution of the sub-routine shown in FIG. 3 for abnormality determination and then returns to the main routine.

In contrast, if the sign of the difference Efo−Efn between previous efficiency Efo and this efficiency Efn is different from that at the previous time (Yes at step S27), at least any one of electricity storage unit 27 and DC/DC converter 21 can be determined to be abnormal. Control circuit 35 receives this change of the sign and outputs an abnormality signal concerning electricity storage unit 27 or DC/DC converter 21 as data signal to the control device provided in the vehicle (S31).

The control device provided in the vehicle receives this data signal and warns the driver of the abnormality of electricity storage device 11 so as to demand its repair. Meanwhile, control circuit 35 finishes the sub-routine shown in FIG. 2 for abnormality determination and then returns to the main routine.

As described above, control circuit 35 in this embodiment 1 detects input/output voltage value Vi, input/output current value I, electricity storage unit voltage value Vc and temperature T, and obtains predetermined range from Emin to Emax and efficiency Efn of DC/DC converter 21 according to these parameters. When efficiency Efn exceeds the predetermined range, at least anyone of electricity storage unit 27 and DC/DC converter 21 is determined to be abnormal. When efficiency Efn lies in the predetermined range, previous efficiency Efo is compared with this efficiency Efn, and at least any one of electricity storage unit 27 and DC/DC converter 21 is determined to be abnormal based on the sign of the difference. As a result, reliability of electricity storage device 11 is increased.

In addition, in this embodiment 1, temperature sensor is disposed in DC/DC converter 21. However, when temperature T is hardly changed such as, for example, electricity storage device 11 is used as an auxiliary power supply for emergency, the influence by temperature T in the predetermined range from Emin to Emax may not be considered. This case may not adopt temperature sensor 31.

Embodiment 2

Figure 4:
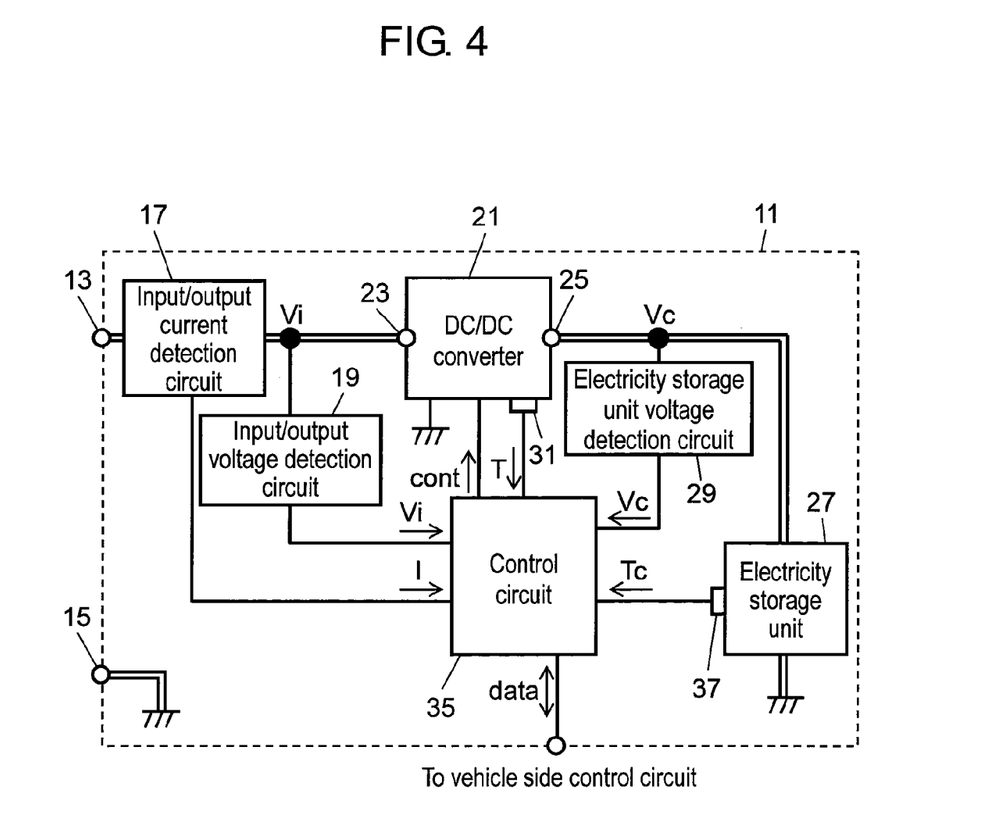
FIG. 4 is a block circuit diagram of an electricity storage device according to an embodiment 2 of the present invention.
Figure 5:
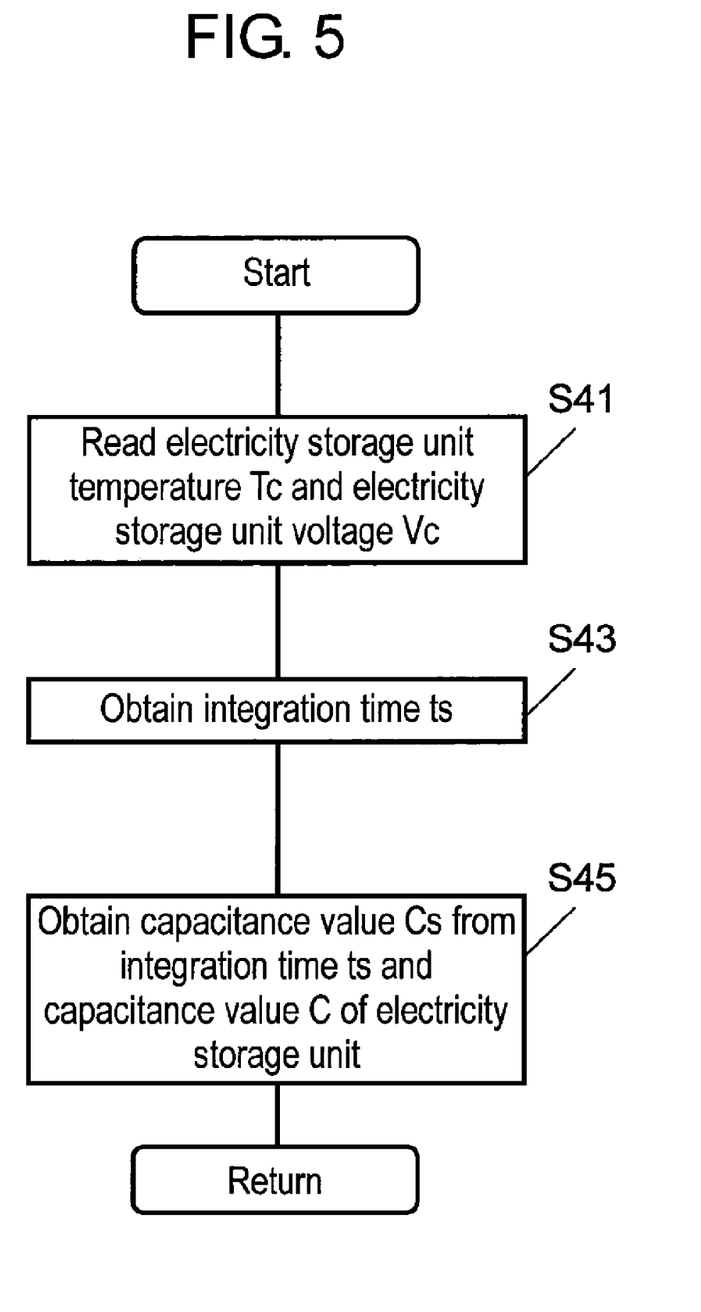
FIG. 5 is a flowchart illustrating calculation of the capacitance value of an electricity storage unit of the electricity storage device according to the embodiment 2 of the present invention.
Figure 6:
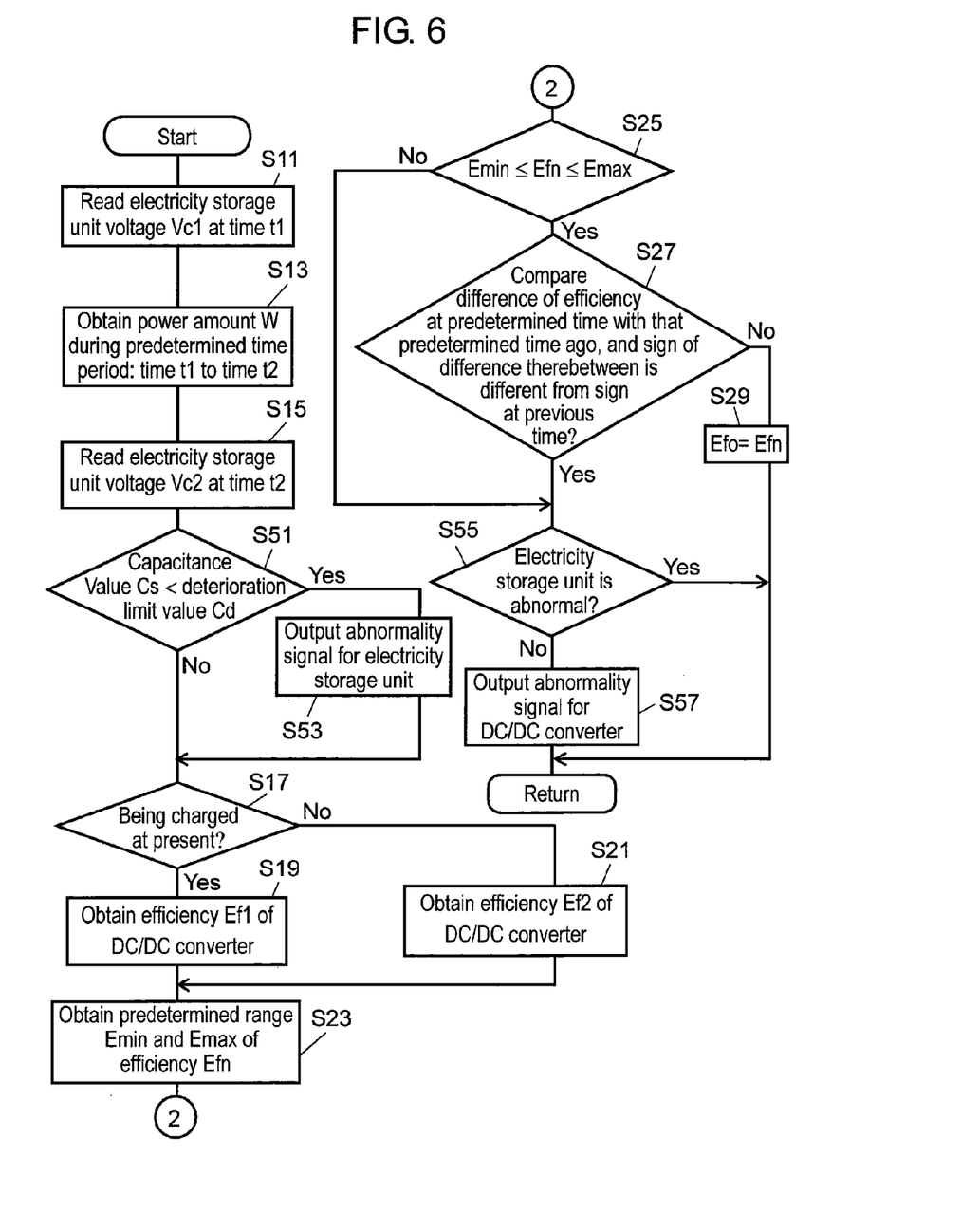
FIG. 6 is a flowchart illustrating abnormality determination for the electricity storage device according to the embodiment 2 of the present invention.

FIG. 4 is a block circuit diagram of an electricity storage device according to an embodiment 2 of the present invention. FIG. 5 is a flowchart illustrating calculation of the capacitance value of an electricity storage unit of the electricity storage device according to the embodiment 2 of the present invention. FIG. 6 is a flowchart illustrating abnormality determination by the electricity storage device according to the embodiment 2 of the present invention. In FIG. 4 in the same manner as FIG. 2, the double line indicates a power line, and the solid line indicates a signal line, respectively.

In FIG. 4, the same elements as FIG. 2 are given the same reference numerals and the detailed description thereof will be quoted. The characteristic configuration in this embodiment 2 is that electricity storage unit temperature sensor 37 is disposed as a temperature sensor in electricity storage unit 27. Electricity storage unit temperature sensor 37 is connected to control circuit 35 via the signal line. Control circuit 35 can read a temperature (hereinafter, referred to as "electricity storage unit temperature Tc") in the vicinity of electricity storage unit 27 from electricity storage unit temperature sensor 37.

An abnormality determination operation by this electricity storage device 11 will now be described with reference to the flowcharts shown in FIGS. 5 and 6.

The characteristic operation in this embodiment 2 is as follows. In the embodiment 1, control circuit 35 calculates efficiency Efn by assuming capacitance value C of electricity storage unit 27 to be constant as an initial value. In this embodiment 2, control circuit 35 calculates efficiency Efn by obtaining capacitance value C at the time of abnormality determination. As a result, the embodiment 2 can obtain efficiency Efn with more accuracy than the embodiment 1. Hereinafter, a detailed operation thereof will be described.

To begin with, capacitance value C can be obtained by using the sub-routine in FIG. 5. The sub-routine in FIG. 5 is executed by interruption every preset time interval Δt. Control circuit 35 permits this interruption at the same time as starting of electricity storage device 11 and repeats the operation for obtaining capacitance value C.

In this embodiment 2, predetermined time interval Δt is set to 0.1 second. When the sub-routine in FIG. 5 is executed, control circuit 35 reads electricity storage unit temperature Tc from electricity storage unit temperature sensor 37 and electricity storage unit voltage value Vc from electricity storage unit voltage detection circuit 29 (S41). Next, control circuit 35 calculates integration time ts needed when obtaining capacitance value C (S43). Integration time ts refers to the total time electricity storage unit 27 has stored power since its new product state until the present. Applied electricity storage unit voltage value Vc or electricity storage unit temperature Tc has much influence on a lifespan of an electric double layer capacitor constituting electricity storage unit 27. Thereby, control circuit 35 calculates integration time is considering their influence as follows.

The electric double layer capacitor has a tendency that as applied electricity storage unit voltage value Vc increases, its lifespan becomes shorter in an exponential function manner. In addition, electric double layer capacitor has a tendency that as electricity storage unit temperature Tc increases, its lifespan becomes shorter in an exponential function manner.

Voltage deterioration coefficient K(Vc) is obtained in advance from a relation between electricity storage unit voltage value Vc and the lifespan of the electric double layer capacitor. As for voltage deterioration coefficient K(Vc), when electricity storage unit 27 is applied with a reference voltage, that is, 12 V in this embodiment 2, voltage deterioration coefficient K(12V) is designated as 1. Thereafter, when electricity storage unit 27 is applied with electricity storage unit voltage value Vc, the voltage deterioration coefficient is calculated by the reciprocal of how many times electricity storage unit 27 has a lifespan longer than application of the reference voltage. As electricity storage unit voltage value Vc applied to electricity storage unit 27 increases, voltage deterioration coefficient K(Vc) becomes greater.

In detail, electricity storage unit voltage value Vc10 which makes voltage deterioration coefficient K(Vc10) equal to 2 is applied to electricity storage unit 27 during the same time interval Δt. This state corresponds to a state where the reference voltage 12 V is applied to electricity storage unit 27 during twice longer than the time interval Δt. Therefore, control circuit 35 adds 2×Δt as integration time ts. The influence by electricity storage unit voltage value Vc applied to electricity storage unit 27 is reflected in integration time ts in this way. Voltage deterioration coefficient K(Vc) is stored in the memory embedded in control circuit 35 in advance.

Likewise, temperature deterioration coefficient K(Tc) is also obtained from a relation between electricity storage unit temperature Tc and the lifespan of the electric double layer capacitor. As for temperature deterioration coefficient K(Tc), when electricity storage unit 27 reaches a reference temperature, that is, 25° C. in this embodiment 2, temperature deterioration coefficient K(25° C.) is designated as 1. Thereafter, when electricity storage unit 27 is used under circumstances where it reaches electricity storage unit temperature Tc, the temperature deterioration coefficient is calculated by a reciprocal of how many times electricity storage unit 27 has a lifespan longer than its use under the reference temperature. As electricity storage unit temperature Tc at electricity storage unit 27 increases, temperature deterioration coefficient K(Tc) becomes greater.

In detail, electricity storage unit 27 is used at electricity storage unit temperature Tc10 which makes temperature deterioration coefficient K(Tc10) equal to 2 during the same time interval $\Delta t$. This state corresponds to a state where electricity storage unit 27 is used at 25° C. during twice longer than the time interval $\Delta t$. Therefore, control circuit 35 adds 2×$\Delta t$ as integration time ts. The influence by electricity storage unit temperature Tc when electricity storage unit 27 is used is reflected in integration time ts in this way. Temperature deterioration coefficient K(Tc) is stored in the memory embedded in control circuit 35 in advance.

By using the above calculations, control circuit 35 can reflect the influences on the lifespan of electricity storage unit 27 by electricity storage unit voltage value Vc and electricity storage unit temperature Tc, in integration time ts. In detail, control circuit 35 calculates voltage deterioration coefficient K(Vc) based on electricity storage unit voltage value Vc and temperature deterioration coefficient K(Tc) based on electricity storage unit temperature Tc every predetermined time interval $\Delta t$. Control circuit 35 adds a value obtained by multiplying voltage deterioration coefficient K(Vc) by temperature deterioration coefficient K(Tc) at predetermined time interval $\Delta t$, to integration time ts. In other words, a new integration time becomes ts+$\Delta t$×K(Vc)×K(Tc). In this way, even when electricity storage unit voltage value Vc applied to electricity storage unit 27 or electricity storage unit temperature Tc at the time of use of electricity storage unit 27 is changed, control circuit 35 can grasp the integration time of electricity storage unit 27 which is converted into the reference voltage and the reference temperature. Although the reference voltage is 12 V and the reference temperature is 25° C. in this embodiment 2, optimum values according to characteristics of components used in electricity storage unit 27 may be selected as these values.

Subsequently, control circuit 35 obtains capacitance value Cs in integration time ts on the basis of new integration time ts obtained at step S43 (S45). Capacitance value Cs is a reflection of electricity storage unit voltage value Vc and electricity storage unit temperature Tc having influence on capacitance value C of the electricity storage unit 27 when the electricity storage unit 27 is actually used for time ts. Generally, in the relation between integration time ts and capacitance value C, as integration time ts increases, capacitance value C becomes smaller nonlinearly. In this embodiment 2, in order to heighten accuracy, capacitance value Cs is calculated based on new integration time ts in which the usage situation of electricity storage unit 27 is reflected at integration time ts. Capacitance value Cs obtained in this way is stored in the memory embedded in control circuit 35.

Thereafter, the sub-routine shown in FIG. 5 is completed, and the process goes back to the control flow of the interruption origin.

By this operation, capacitance value C of electricity storage unit 27 is updated every predetermined time interval $\Delta t$ and thereby the latest capacitance value Cs can be always obtained.

An abnormality determination operation for electricity storage device 11 will be described with reference to the flowchart in FIG. 6. The sub-routine shown in FIG. 6 is executed by designating the predetermined time as 2 seconds in the same manner as FIG. 3.

In FIG. 6, the steps performing the same operation as the sub-routine shown in FIG. 3 are given the same step numbers and the detailed description thereof will be quoted, and the steps performing an operation different from it will be described.

To begin with, in FIG. 6, after step S15, control circuit 35 reads current capacitance value Cs from the memory. In addition, it reads capacitance value Cd which is stored in the memory in advance and indicates a deterioration limit of capacitance value C. Current capacitance value Cs is compared with capacitance value Cd indicating a deterioration limit (S51). Capacitance value Cd indicating deterioration limit is the capacitance value in a limit state where electricity storage unit 27 cannot be used any longer.

If capacitance value Cs is equal to or more than value Cd indicating deterioration limit (No at step S51), control circuit 35 determines electricity storage unit 27 to be normal and then continuously performs control after step S17.

In contrast, if capacitance value Cs is smaller than value Cd indicating deterioration limit (Yes at step S51), control circuit 35 determines electricity storage unit 27 to be abnormal. Control circuit 35 transmits the occurrence of an abnormality in electricity storage unit 27 to the control circuit provided in the vehicle via data signal data (S53). Control circuit provided in the vehicle warns the driver of the occurrence of an abnormality in electricity storage unit 27 so as to demand its repair. The operation after step S17 is continuously performed.

An operation of control circuit 35 will be described when No at step S25 and when Yes at step S27.

In this case, control circuit 35 determines whether or not electricity storage unit 27 is abnormal (S55). The abnormality or not of electricity storage unit 27 can be determined by whether or not step S53 is performed. If electricity storage unit 27 is abnormal (Yes at step S55), since control circuit 35 already has output the abnormality signal concerning electricity storage unit 27 at step S53, it finishes the sub-routine shown in FIG. 6 in the current state and then returns to the main routine.

On the other hand, if electricity storage unit 27 is not abnormal (No at step S55), control circuit 35 determines DC/DC converter 21 to be abnormal. In this case, as described in the embodiment 1, when No at step S25 and when Yes at step S27, control circuit 35 determines at least DC/DC converter 21 or any one of it and electricity storage unit 27 to be abnormal. However, in the sub-routine shown in FIG. 6, since electricity storage unit 27 has been already determined to be normal at step S51, control circuit 35 can determine DC/DC converter 21 to be abnormal. Control circuit 35 outputs an abnormality signal concerning DC/DC converter 21 to the control circuit provided in the vehicle (S57). Control circuit 35 finishes the sub-routine shown in FIG. 6 and then returns to the main routine.

As apparent from the above description, the characteristics of this embodiment 2 are as follows.

When capacitance value Cs of electricity storage unit 27 obtained at integration time is is smaller than value Cd indicating deterioration limit, control circuit 35 determines electricity storage unit 27 to be abnormal. Control circuit 35 determines whether obtained efficiency Efn lies out of the predetermined range from Emin to Emax or obtained efficiency Efn lies in the predetermined range from Emin to Emax. When efficiency Efn lies in the predetermined range from Emin to Emax, control circuit 35 checks the sign of the difference (=Efo−Efn) between previous efficiency Efo and this efficiency Efn. As a result, the sign is different from that at the previous time, and when electricity storage unit 27 is normal, DC/DC converter 21 is determined to be abnormal.

By the above-described configuration and operation, control circuit 35 can discriminate and determine that abnormality occurs in any one of electricity storage unit 27 and DC/DC converter 21. As a result, reliability of electricity storage device 11 not only increases but its serviceability also increases since only the abnormal part need be repaired.

In this embodiment 2, while electricity storage device is being used, integration time ts is updated every predetermined time interval Δt, by using the interruption sub-routine shown in FIG. 5. When use of electricity storage device 11 is completed, the power stored in electricity storage unit 27 is all discharged. Thereby, when the vehicle is not used, power cannot be stored in electricity storage unit 27 and thus integration time ts is not needed to be updated. As a result, when the vehicle is not used, a dark current needed for update of integration time ts can be made unnecessary. In this case, however, since the power discharged from electricity storage unit 27 is not useful, even when the vehicle is not used, a configuration in which power is continuously stored in electricity storage unit 27 is also possible. At this time, electricity storage unit 27 stores power all the time regardless of use or nonuse of the vehicle, and thus integration time ts is continuously required to be updated even when the vehicle is not used.

The electric double layer capacitor has been used as electricity storage unit 27 in the embodiments 1 and 2. However, other capacitors such as an electrochemical capacitor or the like may be used.

Further, a case where electricity storage device 11 is applied to the regeneration system of the vehicle has been described as an example in the embodiments 1 and 2. However, the present invention is not limited to this example but can be applied to a vehicle auxiliary power supply or the like for use in a hybrid car or in each system such as an idling stop, an electric power steering, a vehicle braking system, an electric supercharger and so forth. Further, it can be applied to an emergency auxiliary power supply and so forth in addition to a vehicle.

INDUSTRIAL APPLICABILITY

In the electricity storage device related to the present invention, it is possible to determine occurrence of an abnormality in any one of DC/DC converter and electricity storage unit, and thereby its reliability increases. Specially, it is useful as a vehicle electricity storage device or the like in which power stored in the electricity storage unit at the time of braking is discharged when needed except for when braking.

The invention claimed is:

1. An electricity storage device storing power generated from a generator, comprising:
    an electricity storage unit;
    a DC/DC converter having an electricity storage unit terminal connected to the electricity storage unit and an input/output terminal configured to be connected to the generator;
    an electricity storage unit voltage detection circuit configured to detect a voltage value of the electricity storage unit from the electricity storage unit terminal;
    an input/output voltage detection circuit configured to detect a voltage value of power input to and output from the DC/DC converter from the input/output terminal;
    an input/output current detection circuit configured to detect a current value of power input to and output from the DC/DC converter; and
    a control circuit,
    wherein the control circuit calculates an efficiency of the DC/DC converter when the DC/DC converter carries current, by use of an input and output power amount for the DC/DC converter calculated based on the voltage value detected by the input/output voltage detection circuit and the current value detected by the input/output current detection circuit, and a power amount for the electricity storage unit calculated based on the voltage value detected by the electricity storage unit voltage detection circuit and a capacitance value of the electricity storage unit; determines the electricity storage unit and the DC/DC converter to be normal when the efficiency lies in a predetermined range; and determines at least one of the electricity storage unit and the DC/DC converter to be abnormal when the efficiency lies out of the predetermined range.

2. The electricity storage device of claim 1, wherein the control circuit calculates the efficiency by use of Equation 2 during a predetermined time period when the DC/DC converter carries current and when the electricity storage unit is charged, $$Ef1 = \frac{C \cdot |Vc2^2 - Vc1^2|}{2 \cdot \int_{t1}^{t2}(Vi \cdot I)dt} \qquad \text{[Equation 2]}$$

where the predetermined time period is from time t1 to time t2, Vi represents the input/output voltage value detected by the input/output voltage detection circuit, I represents the input/output current value detected by the input/output current detection circuit, Vc1 represents an electricity storage unit voltage value detected by the electricity storage unit voltage detection circuit at the time t1, Vc2 represents an electricity storage unit voltage value detected by the electricity storage unit voltage detection circuit at the time t2, C represents the capacitance value of the electricity storage unit, and Ef1 represents the efficiency of the DC/DC converter, and wherein the control circuit calculates the efficiency by use of Equation 3 during a predetermined time period when the DC/DC converter carries current and when the charging unit is discharged, $$Ef2 = \frac{2 \cdot \int_{t1}^{t2}(Vi \cdot I)dt}{C \cdot |Vc2^2 - Vc1^2|} \qquad \text{[Equation 3]}$$

where the predetermined time period is from time t1 to time t2, Vi represents the input/output voltage value detected by the input/output voltage detection circuit, I represents the input/output current value detected by the input/output current detection circuit, Vc1 represents an electricity storage unit voltage value detected by the electricity storage unit voltage detection circuit at the time t1, Vc2 represents an electricity storage unit voltage value detected by the electricity storage unit voltage detection circuit at the time t2, C represents the capacitance value of the electricity storage unit, and Ef2 represents the efficiency of the DC/DC converter.

3. The electricity storage device of claim 1, wherein the control circuit calculates the predetermined range, based on the voltage value of power input to and output from the DC/DC converter, the current value of power input to and output from the DC/DC converter, and the voltage value of the electricity storage unit.

4. The electricity storage device of claim 3, wherein when the electricity storage unit and the DC/DC converter are determined to be normal, the control circuit stores an efficiency as the predetermined range, the efficiency being calculated based on:
   a changeable value of the voltage value of power input to and output from the DC/DC converter;
   a changeable value of the current value of power input to and output from the DC/DC converter; and
   a changeable value of the voltage value of the electricity storage unit.

5. The electricity storage device of claim 1, further comprising a temperature sensor configured to detect a temperature of the DC/DC converter,
   wherein the control circuit calculates the predetermined range based on:
   the voltage value of power input to and output from the DC/DC converter;
   the current value of power input to and output from the DC/DC converter;
   the voltage value of the electricity storage unit; and
   the temperature detected by the temperature sensor.

6. The electricity storage device of claim 5, wherein when the electricity storage unit and the DC/DC converter are determined to be normal, the control circuit stores an efficiency as the predetermined range, the efficiency being calculated based on:
   a changeable value of the voltage value of power input to and output from the DC/DC converter;
   a changeable value of the current value of power input to and output from the DC/DC converter;
   a changeable value of the voltage value of the electricity storage unit; and
   the temperature to be detected by the temperature sensor.

7. The electricity storage device of claim 1, wherein when the efficiency lies in the predetermined range, the control circuit determines at least any one of the electricity storage unit and the DC/DC converter to be abnormal when the sign of the difference between a previous efficiency obtained a predetermined time ago and the presently obtained efficiency is different from the sign of the difference between an efficiency before the previous efficiency obtained at an earlier predetermined time and the previous efficiency.

8. The electricity storage device of claim 2, further comprising an electricity storage unit temperature sensor configured to detect a temperature of the electricity storage unit,
   wherein the control circuit stores:
      a voltage deterioration coefficient which is a reciprocal number of a ratio of a first electricity storage unit lifespan obtained when the electricity storage unit voltage is applied to the electricity storage unit, with respect to a reference lifespan obtained when a reference voltage is applied to the electricity storage unit at a reference temperature;
      a temperature deterioration coefficient which is the reciprocal number of a ratio of a second electricity storage unit lifespan at an electricity storage unit temperature detected by the electricity storage unit temperature sensor with respect to the reference lifespan at the electricity storage unit temperature detected by the electricity storage unit temperature sensor; and
      a correlation between an elapsed time obtained when the reference voltage is applied at the reference temperature and the capacitance value of the electricity storage unit, and
   wherein the control circuit calculates the voltage deterioration coefficient and the temperature deterioration coefficient every time interval; adds, to an integration time during which the electricity storage unit stores power, a value obtained by multiplying each time interval by the voltage deterioration coefficient and the temperature deterioration coefficient; and calculates the capacitance value which the electricity storage unit has, based on the correlation and the integration time.

9. The electricity storage device of claim 8, wherein the control circuit stores the deterioration limit value which is the allowable deterioration as the capacitance of the electricity storage unit; compares the capacitance value with the deterioration limit value and determines the electricity storage unit to be abnormal when the capacitance value is smaller than the deterioration limit value; and determines the DC/DC converter to be abnormal when the electricity storage unit is normal while the efficiency calculated based on the (Equation 2) or (Equation 3) lies out of the predetermined range.

10. The electricity storage device of claim 1, wherein the control circuit outputs an abnormality signal when at least any one of the electricity storage unit and the DC/DC converter is determined to be abnormal.

* * * * *